(12) United States Patent
Xu et al.

(10) Patent No.: US 7,723,163 B2
(45) Date of Patent: May 25, 2010

(54) METHOD OF FORMING PREMOLDED LEAD FRAME

(75) Inventors: Xue-song Xu, Tianjin (CN); Zhi-gang Bai, Tianjin (CN); Nan Xu, Tianjin (CN); Jin-zhong Yao, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/126,943

(22) Filed: May 26, 2008

(65) Prior Publication Data

US 2009/0098686 A1    Apr. 16, 2009

(30) Foreign Application Priority Data

Oct. 16, 2007    (CN) .......................... 2007 1 0180243

(51) Int. Cl.
*H01L 21/00* (2006.01)
(52) U.S. Cl. ...................... 438/123; 438/124; 257/666; 257/E21.499
(58) Field of Classification Search .................. 438/106, 438/111, 112, 118, 123, 124, 126, 127; 257/666, 257/676, 678, 690, 692, E33.066, E23.031, 257/E23.042, E21.499
See application file for complete search history.

(56) References Cited

U.S. PATENT DOCUMENTS

| | | | |
|---|---|---|---|
| 5,098,863 A | 3/1992 | Dolezal et al. | |
| 5,640,746 A | 6/1997 | Knecht et al. | |
| 5,869,883 A | 2/1999 | Mehringer et al. | |
| 6,097,101 A | 8/2000 | Sato et al. | |
| 6,291,880 B1 | 9/2001 | Ogawa et al. | |
| 6,696,752 B2 * | 2/2004 | Su et al. ..................... | 257/678 |
| 6,858,474 B1 | 2/2005 | Koay et al. | |
| 7,102,214 B1 | 9/2006 | Miks et al. | |
| 7,132,315 B2 * | 11/2006 | Minamio et al. ............ | 438/123 |
| 7,173,321 B2 * | 2/2007 | Kim ........................... | 257/668 |
| 2003/0224553 A1 | 12/2003 | Manansala | |
| 2006/0108670 A1 | 5/2006 | Bambridge | |
| 2007/0001278 A1 | 1/2007 | Jeon et al. | |

* cited by examiner

*Primary Examiner*—Khiem D Nguyen
(74) *Attorney, Agent, or Firm*—Charles E. Bergere

(57) ABSTRACT

A method of forming a pre-molded lead frame having increased stand-offs includes the steps of attaching a first tape to a first side of the lead frame and a second tape to a second side of the lead frame. The taped lead frame is placed in a mold and a first flow of mold compound is initiated. The first flow of the mold compound fills a space between the first tape and an upper mold chase of the mold. A second flow of the mold compound then is initiated. The second flow of the mold compound fills the spaces between a die pad and leads of the lead frame. The first and second tapes then are removed from the lead frame. Improved stand-offs are provided because the first tape was depressed by the first flow of the mold compound.

15 Claims, 3 Drawing Sheets

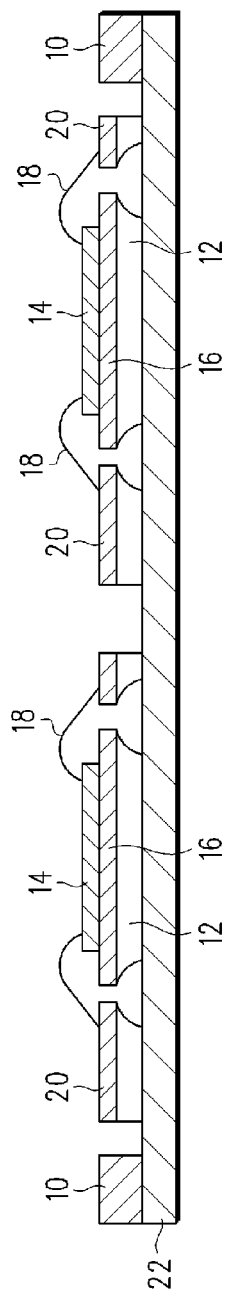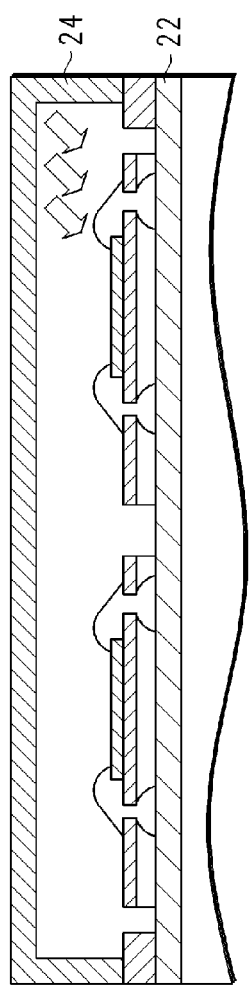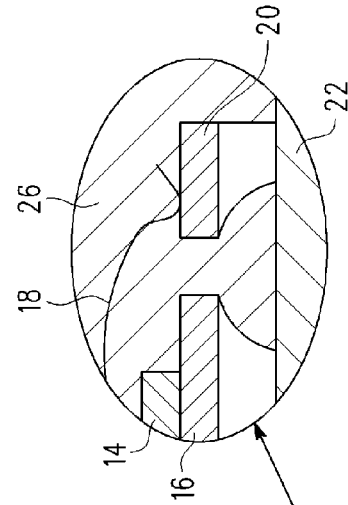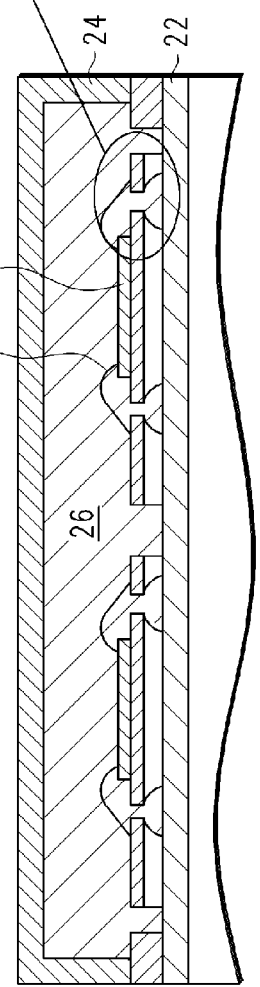
FIG. 1 -PRIOR ART-
FIG. 2 -PRIOR ART-
FIG. 3 -PRIOR ART-
FIG. 4 -PRIOR ART-

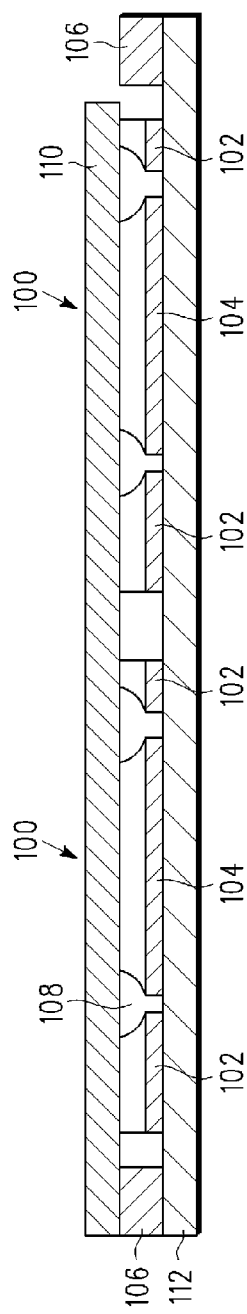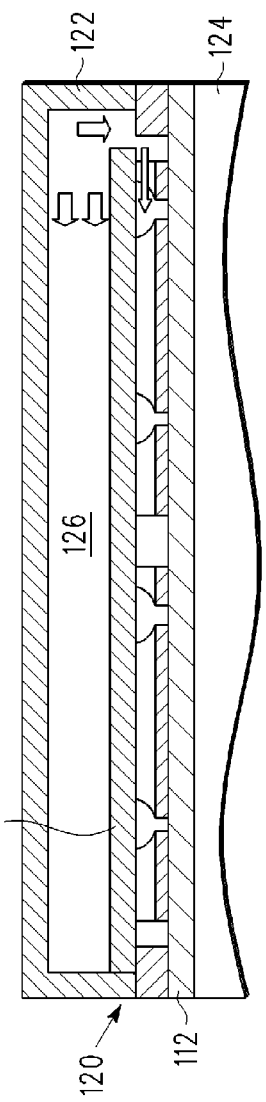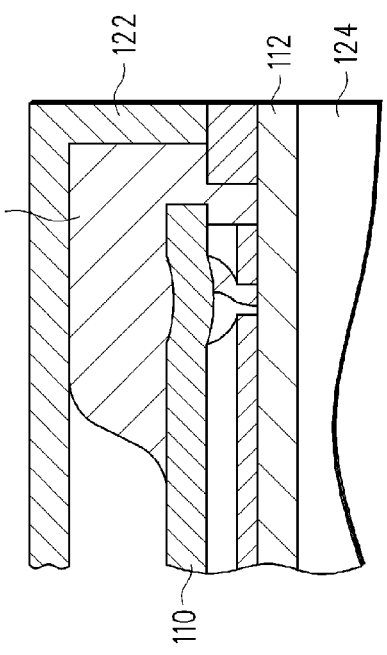

METHOD OF FORMING PREMOLDED LEAD FRAME

BACKGROUND OF THE INVENTION

The present invention relates to the packaging of integrated circuits (ICs) and more particularly to a method of forming a pre-molded lead frame used to form a semiconductor package.

A lead frame is a structure that provides electrical interconnections to a semiconductor die. That is, a die is attached to a lead frame and then bonding pads of the die are electrically connected to leads of the lead frame, typically with wires via a wire bonding process. The die, lead frame and wires are then encapsulated with a plastic mold compound. Exposed areas of the leads provide the electrical interconnection to the die.

In order to provide good electrical connection to other devices, certain portions of the leads must be adequately exposed. If this lead area is covered with mold compound or otherwise not well exposed or easily contactable then issues can arise such as solderability of the leads to a substrate or printed circuit board (PCB).

FIGS. 1-4 illustrate steps in a semiconductor packaging process. FIG. 1 shows a pair of lead frames 10 including half-etched portions 12. Integrated circuits 14 are attached to flags 16 of the lead frames 10. The integrated circuits 14 are electrically connected to leads 20 of the lead frames 10 with wires 18, typically via a wire bonding process. In the drawing, the two lead frames 10 are part of a strip of lead frames. The strip of lead frames is secured to a tape 22. FIG. 2 shows the lead frames 10 located inside a mold chase 24. The arrows indicate a direction of mold flow. FIG. 3 shows a mold compound 26 that has been injected into the mold chase 24. The mold compound 26 covers the lead frames 10, the integrated circuits 14 and the wires 18.

FIG. 4 is an enlarged view of a contact area of one of the lead frames 10, particularly, the half-etched portions of the flag 16 and lead 20. Note that the mold compound 26 fills the space between the flag 16 and the lead 20, and further, the mold compound 26 and the bottom surface of the lead frame are planar. It would be advantageous to be able to increase the stand-off between the lead frame and the mold compound.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

FIG. 1 is an enlarged cross-sectional view of a conventional lead frame strip with dies attached thereto;

FIG. 2 is an enlarged cross-sectional view of the lead frame of FIG. 1 located within a mold chase;

FIG. 3 is an enlarged cross-sectional view of the lead frame in the mold chase of FIG. 2 with a mold compound injected therein;

FIG. 4 is a greatly enlarged cross-sectional view of a portion of the lead frame of FIG. 1 after removal from the mold chase;

FIGS. 5-9 are enlarged cross-sectional views illustrating a method of forming a pre-molded a lead frame in accordance with an embodiment of the present invention.

DETAILED DESCRIPTION OF THE INVENTION

Figure 8:
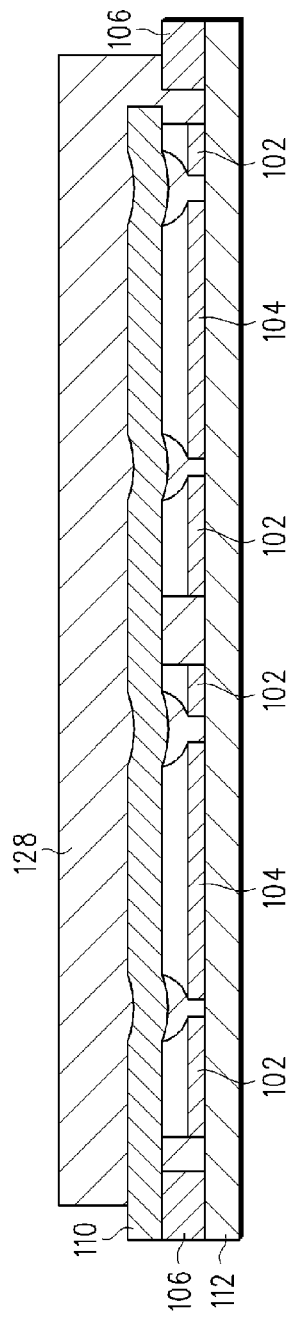

The detailed description set forth below in connection with the appended drawings is intended as a description of a presently preferred embodiment of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

In one embodiment, the present invention provides a method of forming a pre-molded lead frame including the steps of attaching a first tape to a first side of a lead frame, the lead frame including leads and a die pad, and attaching a second tape to a second, opposing side of the lead frame. The taped lead frame is loaded into a mold and a first flow of a mold compound is injected into the mold such that the mold compound flows into a space between the first tape and an upper mold chase. A second flow of the mold compound into the mold is initiated and the mold compound flows into a space between the first and second tapes (i.e., between the leads and the die pad of the lead frame). The lead frame is removed from the mold and the first and second tapes are removed so that the leads and the die pad are exposed. Alternatively, the second tape may be removed and the first tape left on for further processing.

In another embodiment, the present invention provides a method of pre-molding a plurality of lead frames. This method is similar to the above method except that a plurality of lead frames is taped and placed in the mold. The lead frames may be provided in a strip or array form and later separated with a singulation process.

In yet another embodiment of the invention, a method of packaging a semiconductor integrated circuit is provided. The method includes attaching a first tape to a first side of a lead frame, the lead frame including leads and a die pad, and attaching a second tape to a second, opposing side of the lead frame; loading the lead frame into a mold; initiating a first flow of a mold compound into the mold, wherein the mold compound flows into a space between the first tape and an upper mold chase of the mold; initiating a second flow of the mold compound into the mold, wherein the mold compound flows into a space between the first and second tapes; removing the lead frame from the mold; and removing the second tape from the lead frame, whereby the leads and die pad of the lead frame are exposed. Next, a semiconductor integrated circuit is attached to the die pad and a wire bonding process is performed to attach wires between pads on the integrated circuit and the leads of the lead frame. The lead frame, integrated circuit and wires are encapsulated with a mold compound and then the first tape is removed from the first side of the lead frame, thereby providing a packaged semiconductor integrated circuit. The first flow of the mold compound depresses the first tape between the leads and the die pad such that stand-offs are formed upon removal of the first tape.

A method of forming a pre-molded lead frame will now be described with reference to FIGS. 5-9.

Referring now to FIG. 5, one or more lead frames 100 are provided (in this case, two are shown). The lead frames 100 include leads 102 that may surround respective die pads 104. The lead frames 100 may be bounded by side bars 106. The lead frames 100 may be formed by cutting, stamping or etching sheet stock into a strip or array format. The sheet stock from which the lead frames 100 are formed is a conductive metal like copper or aluminum, although other metals or alloys can be used and could be coated. In one embodiment, the conductive material sheet 102 is formed of a bare metal such as copper foil and is about 0.5 mm thick. However, the present invention is not limited by the specific material, size or thickness of the metal sheet 102. Lead frames are well known in the art and the material thicknesses, strength, etc. of such lead frames are well known. Lead frames are extensively used in the semiconductor industry and readily available from many commercial suppliers. A first or top side of the leads frames 100 has been etched so that the space between the leads 102 and the die pads 104 is increased, as shown at 108.

A first tape 110 is disposed over a first surface of the lead frames 100. Preferably, the first tape 110 extends from one of the side bars 106 almost to the other, opposing side bar 106 and covers the etched side of the lead frames 100. The first tape 110 covers about 95% of the first side of the lead frames 100. A second tape 112 is disposed over a second side surface of the lead frames 100. The second side surface opposes the first side surface to which the first tape 110 is attached. The second tape 112 preferably extends from one side bar 106 to the other side bar 106. The first and second tapes 110 and 112 are made of a strong, resilient material that can withstand high temperatures. Such tapes are known and readily commercially available in the semiconductor industry.

Referring to FIG. 6, after both sides of the lead frames 100 have been taped, the lead frames 100 are loaded into a mold 120. That is, the lead frames 100 are clamped between the edges of upper and lower mold chases 122 and 124 so that a molding compound can be injected into the cavity 126 between the upper and lower mold chases 122 and 124. According to the present invention, a first flow of a mold compound is initiated into the mold 120 such that the mold compound flows into the space between the first tape 110 and the upper mold chase 122, as indicated by the bold, horizontal arrows. A second flow of the mold compound into the mold chase 120 is also initiated. The second flow of the mold compound flows into a space between the first and second tapes; that is, into the spaces between the side bars 106 and the lead frames 100 and between the leads 102 and the die pads 104, as indicated by the non-bolded arrows.

FIG. 7 shows a mold compound 128 as it flows into the mold cavity 126. As can be seen, the first flow of the mold compound 128 over the first tape 110 depresses the first tape 110 over the enlarged spaces between the leads 102 and the die pads 104 such that increased stand-offs will be formed (see FIG. 9). The second flow of the mold compound 128 flows between the space between the first tape 110 and the side bar 106 (right side bar in drawing) so that the mold compound flows into the spaces between the leads 102 and the die pads 104. In one embodiment of the invention, the first flow of the mold compound 128 substantially fills the space between the upper mold chase 122 and the first tape 110 before the second mold flow is initiated. The first flow of the mold compound 128 has a greater velocity than that of the second flow of the mold compound.

Figure 9:
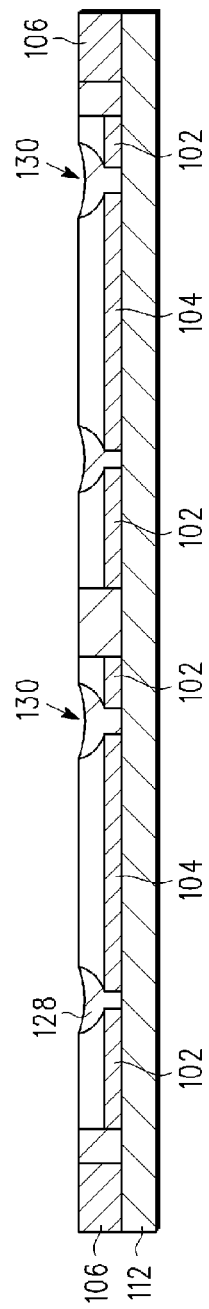

After the mold compound 128 fills the mold 120, the lead frames 100 are removed from the mold, as shown in FIG. 8. As can be seen, the first tape 110 dips into the spaces between the leads 102 and the die pads 104. FIG. 9 shows the lead frames 100 after the first tape 110 has been removed via a de-taping process such that a surface of the leads 102 and the die pads 104 is exposed. With the first tape 110 removed, the increased stand-offs indicated at 130 can be seen.

Figure 10:
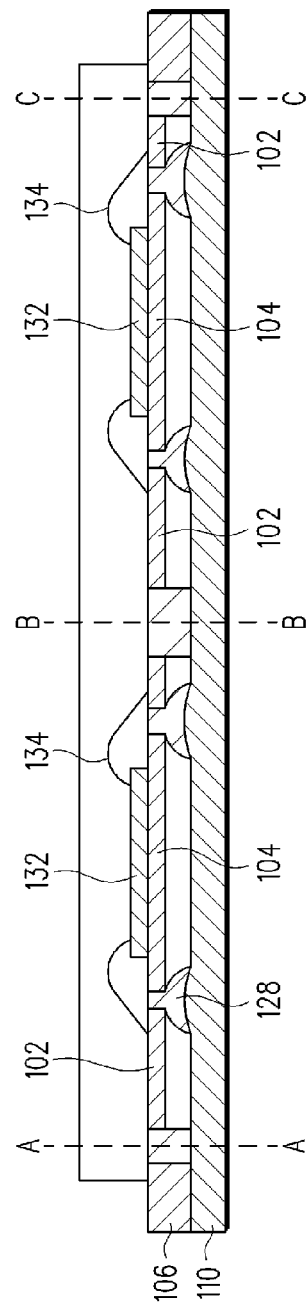
FIG. 10 is an enlarged cross-sectional view illustrating a method of packaging a semiconductor integrated circuit in accordance with an embodiment of the invention.

Referring to FIG. 10, in one embodiment of the invention, after the lead frames 100 are removed from the mold 120, the second tape 112 is removed and the first tape 110 is left on the lead frames 100. Note the mold compound 128 located between the leads and the die pads 104 remains. Semiconductor integrated circuits 132 are attached to the exposed portions of the die pads 104 and then a wire bonding process is performed to attach wires 134 between pads on the integrated circuits 132 to respective ones of the leads 102. The integrated circuits 132 may be processors, such as digital signal processors (DSPs), microcontrollers, special function circuits, such as memory address generators, or circuits that perform any other type of function. The integrated circuits 132 are not limited to a particular technology such as CMOS, or derived from any particular wafer technology. Further, the present invention can accommodate various die sizes, as will be understood by those of skill in the art. A typical example is a flash memory device having a size of about 6 mm by 6 mm.

The assembly then is placed into a mold, such as the mold 120, and more mold compound is injected around the integrated circuits 132 and the wires 134. After removal from the mold 120, a singulation or dicing operation is performed along the saw streets, indicated with dotted lines A-A, B-B and C-C to form separate, packaged devices. In FIG. 10, the packaged devices comprise Quad Flat No-lead type (QFN) devices. However, the method described above for forming pre-molded lead frames is not limited to QFN type lead frames.

As is evident from the foregoing discussion, the present invention provides pre-molded lead frames with increased lead stand-offs. The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

The invention claimed is:

1. A method of pre-molding a lead frame, comprising:
    attaching a first tape to a first side of a lead frame, the lead frame including leads and a die pad;
    attaching a second tape to a second, opposing side of the lead frame;
    loading the lead frame into a mold;
    initiating a first flow of a mold compound into the mold, wherein the mold compound flows into a space between the first tape and an upper mold chase of the mold;
    initiating a second flow of the mold compound into the mold, wherein the mold compound flows into a space between the first and second tapes;
    removing the lead frame from the mold; and
    removing the first and second tapes from the lead frame, whereby the leads and die pad of the lead frame are exposed, and wherein the first flow of the mold compound depresses the first tape between the leads and the die pad such that stand-offs are formed upon removal of the first tape.

2. The method of pre-molding a lead frame of claim 1, wherein a velocity of the first flow of the mold compound is greater than a velocity of the second flow of the mold compound.

3. The method of pre-molding a lead frame of claim 1, wherein the first flow of mold compound substantially fills the space between the upper mold chase and the first tape before the second mold flow is initiated.

4. The method of pre-molding a lead frame of claim 1 wherein the lead frame comprises a bare metal lead frame.

5. The method of pre-molding a lead frame of claim 1, wherein the lead frame comprises a Quad Flat No-lead type lead frame.

6. A method of pre-molding a plurality of lead frames, comprising:
    attaching a first tape to a first side of the plurality of lead frames, each of the lead frames including leads and a die pad;
    attaching a second tape to a second, opposing side of the lead frames;
    loading the lead frames into a mold;
    initiating a first flow of a mold compound into the mold, wherein the mold compound flows into a space between the first tape and an upper mold chase of the mold;
    initiating a second flow of the mold compound into the mold, wherein the mold compound flows into a space between the first and second tapes;
    removing the lead frames from the mold chase; and
    removing the first and second tapes from the lead frames, whereby the leads and die pads of the lead frames are exposed, and wherein the first flow of the mold compound depresses the first tape between the leads and the die pads such that standoffs are formed upon removal of the first tape.

7. The method of pre-molding a plurality of lead frames of claim 6, wherein a velocity of the first flow of the mold compound is greater than a velocity of the second flow of the mold compound.

8. The method of pre-molding a plurality of lead frames of claim 6, wherein the first flow of mold compound substantially fills the space between the upper mold chase and the first tape before the second mold flow is initiated.

9. The method of pre-molding a plurality of lead frames of claim 6, wherein the lead frames comprise bare metal lead frames.

10. The method of pre-molding a plurality of lead frames of claim 6, wherein the lead frames comprise Quad Flat No-lead type lead frames.

11. A method of packaging a semiconductor integrated circuit, the method comprising the steps of:
    attaching a first tape to a first side of a lead frame, the lead frame including leads and a die pad;
    attaching a second tape to a second, opposing side of the lead frame;
    loading the lead frame into a mold;
    initiating a first flow of a mold compound into the mold, wherein the mold compound flows into a space between the first tape and an upper mold chase of the mold;
    initiating a second flow of the mold compound into the mold, wherein the mold compound flows into a space between the first and second tapes;
    removing the lead frame from the mold chase;
    removing the second tape from the lead frame, whereby the leads and die pad of the lead frame are exposed and wherein the first flow of the mold compound depresses the first tape between the leads and the die pad such that stand offs are formed upon removal of the first tape;
    attaching a semiconductor integrated circuit to the die pad;
    performing a wire bonding process to attach wires between pads on the integrated circuit and the leads of the lead frame;
    encapsulating the lead frame, integrated circuit and wires with a mold compound;
    removing the first tape from the lead frame, thereby providing a packaged semiconductor integrated circuit.

12. The method of packaging a semiconductor integrated circuit of claim 11, wherein a velocity of the first flow of the mold compound is greater than a velocity of the second flow of the mold compound.

13. The method of packaging a semiconductor integrated circuit of claim 11, wherein the first flow of mold compound substantially fills the space between the upper mold chase and the first tape before the second mold flow is initiated.

14. The method of packaging a semiconductor integrated circuit of claim 11, wherein the lead frame comprises a bare metal lead frame.

15. The method of packaging a semiconductor integrated circuit of claim 11, wherein the lead frame comprises a Quad Flat No-lead type lead frame.

\* \* \* \* \*